US008707714B2

(12) United States Patent
Zayer et al.

(10) Patent No.: US 8,707,714 B2
(45) Date of Patent: Apr. 29, 2014

(54) COMPONENT TEMPERATURE CONTROL

(76) Inventors: Nadhum Kadhum Zayer, Devon (GB); Jonathan Stuart Drake, Devon (GB)

( * ) Notice: Subject to any disclaimer, the term of this patent is extended or adjusted under 35 U.S.C. 154(b) by 780 days.

(21) Appl. No.: 12/942,442

(22) Filed: Nov. 9, 2010

(65) Prior Publication Data

US 2012/0087384 A1 Apr. 12, 2012

(30) Foreign Application Priority Data

Oct. 12, 2010 (GB) .................................. 1017159.3

(51) Int. Cl.
*F25B 21/02* (2006.01)
(52) U.S. Cl.
USPC ..................................... 62/3.2; 62/3.7; 62/156
(58) Field of Classification Search
CPC ................. F25B 21/00–21/04; F25B 2600/11; F25B 2347/023; F25B 2600/23
USPC ................... 62/3.3, 3.7, 177, 3.2, 3, 156, 158
See application file for complete search history.

(56) References Cited

U.S. PATENT DOCUMENTS

| 4,821,273 | A | 4/1989 | Hori | |
|---|---|---|---|---|
| 4,858,678 | A * | 8/1989 | Ladd | 165/104.19 |
| 5,548,603 | A | 8/1996 | Calvani et al. | |
| 7,512,162 | B2 | 3/2009 | Gurusami et al. | |
| 7,838,760 | B2 * | 11/2010 | Venkatasubramanian et al. | 136/203 |
| 7,888,793 | B2 * | 2/2011 | Sherrer et al. | 257/712 |
| 2003/0227950 | A1 * | 12/2003 | Oomori | 372/34 |
| 2004/0086008 | A1 | 5/2004 | Gregory et al. | |
| 2005/0161072 | A1 * | 7/2005 | Esser et al. | 136/205 |
| 2005/0212598 | A1 | 9/2005 | Lin et al. | |
| 2006/0033980 | A1 * | 2/2006 | Wagner et al. | 359/291 |
| 2006/0046304 | A1 * | 3/2006 | Shigeura et al. | 436/147 |
| 2006/0239315 | A1 | 10/2006 | Hosking | |
| 2006/0239319 | A1 * | 10/2006 | Kozlovsky et al. | 372/36 |
| 2008/0037601 | A1 | 2/2008 | Nielsen | |
| 2009/0049843 | A1 * | 2/2009 | Albayrak et al. | 62/3.3 |
| 2009/0293500 | A1 | 12/2009 | Chen et al. | |

FOREIGN PATENT DOCUMENTS

| EP | 1 096 626 | 5/2001 |
|---|---|---|
| JP | 6-188503 A | 5/1986 |
| JP | 06-216458 A | 8/1994 |
| JP | 7-248512 A | 9/1995 |
| JP | 9-064447 A | 3/1997 |
| JP | 2006-505140 A | 2/2006 |
| WO | WO 2004/042835 A1 | 5/2004 |

OTHER PUBLICATIONS

British Search Report for corresponding Application No. GB1017159.3 dated Feb. 22, 2011.
Japanese Patent Office, Notice of Reasons for Rejection, Japanese Patent Application No. 2010-253972, mailed Feb. 19, 2013, 5 pages.
European Application No. 10190213.8 Search Report (Nov. 22, 2012).

* cited by examiner

*Primary Examiner* — Mohammad M Ali
(74) *Attorney, Agent, or Firm* — Fenwick & West LLP

(57) ABSTRACT

There is disclosed an electronic apparatus comprising a chip within a casing. A thermoelectric cooler has thermal connections to the chip and the casing and is configured to transport heat from the chip to the casing. A temperature measuring device is provided for determining the temperature of the chip. A control system is configured to maintain the chip at a target temperature by controlling current supplied to the thermoelectric cooler in response to the measured temperature. A temperature selection system is configured to select the chip target temperature dynamically on the basis of the casing temperature.

15 Claims, 3 Drawing Sheets

COMPONENT TEMPERATURE CONTROL

TECHNICAL FIELD

The present invention relates to temperature control of components. In particular, although not exclusively, the invention relates to control of temperature so as to optimise heat dissipation in optoelectronic components.

BACKGROUND

In recent years, for environmental and cost reasons, interest has grown in optical component modules having low power consumption and low thermal dissipation. One application of such modules is in Erbium Doped Fibre Amplifier (EDFA) designs, in which the pump module is one of the biggest contributors to the power consumption and heat dissipation.

Heat is generally removed from such modules using a Thermoelectric Cooler (TEC). A TEC is a solid-state active heat pump device which uses the Peltier effect to transfer heat from one side of the device to the other side against the temperature gradient (from cold to hot), with consumption of electrical energy. The effectiveness of the pump at moving the heat away from the cold side is dependent upon the current provided and how well the heat can be removed from the hot side. The heat transfer is also dependent on the temperature difference ($\Delta T$) between the hot side and the cold side. More current must be provided to provide effective cooling when $\Delta T$ is large.

In the case of optical modules such as those used in EDFA designs, heat is usually transferred from a carrier, in which a chip is mounted, to the casing or package in which the module is contained. The temperature of the casing is usually higher in use than the temperature of the chip, and a TEC is therefore required to effect the heat transfer. The current to the TEC is generally controlled by a feedback loop so that the chip is maintained at a desired target temperature. In order to optimise the power consumption of the TEC, it is desirable to prevent the temperature difference $\Delta T$ between the casing temperature and the Chip on Carrier (CoC) temperature from becoming too large.

One way of achieving low TEC power consumption is to set the target CoC temperature to a high value (e.g. 40° C.). This ensures that $\Delta T$ will be small even for high casing temperatures, and the design thus achieves low power consumption and heat dissipation even at such high casing temperatures. The disadvantage with this approach is that it greatly increases the chip failure rate (FIT rate), which depends on the chip temperature. For example, the FIT rate at 40° C. is double that at 25° C.

One way to overcome this problem is to use an algorithm to adjust the target CoC temperature when the casing temperature of the package gets very high. One way of achieving this is described in U.S. Pat. No. 7,512,162. However, this is difficult to design and implement.

It would therefore be desirable to achieve a lower TEC power consumption with minimum impact on FIT rate, and without the need for complex designs.

SUMMARY

It is an object of the present invention to address, or at least alleviate, the problems described above.

In accordance with one aspect of the present invention there is provided an electronic assembly comprising an electronic device and a heat sink. A heat pump has thermal connections to the device and the heat sink and is configured to transport heat from the device to the heat sink. A first temperature-responsive electrical element is thermally coupled to the device and second temperature-responsive electrical element is coupled to the heat sink. The first element has a property which varies with temperature in a first direction, and the second element has the same property, but which varies with temperature in the opposite direction. A control system is configured to monitor a combined property of the first and second electrical elements in combination and maintain the combined property at a substantially constant value by controlling current supplied to the heat pump, so that a temperature of the device varies dynamically in response to a temperature of the heat sink.

The property of the second electrical component may be substantially constant with temperature below a threshold temperature (e.g. 25° C.), so that at heat sink temperatures below the threshold temperature the control system operates to maintain the device at a substantially constant target temperature. The property of the second electrical component may then vary with temperature above the threshold temperature, so that at heat sink temperatures above the threshold temperature the control system operates to increase the target temperature of the device in line with the heat sink temperature. This allows the temperature of the device to be kept substantially constant at "normal" ambient temperatures but, at higher temperatures, the device is allowed to drift up in temperature in a controlled way so that the power consumption for thermal management does not run away.

The heat sink may be at an ambient temperature of the environment surrounding the assembly, and may be thermally connected to or integral with a casing of the assembly. The heat pump may be a thermoelectric cooler.

The electrical elements may be Thermistors, and the combined property of the two elements in combination may be the total electrical resistance of both Thermistors connected in series. One of the Thermistors may be a Negative Temperature Coefficient (NTC) Thermistor and the other a Positive Temperature Coefficient (PCT) Thermistor. In one embodiment the NTC Thermistor is thermally connected to the device and the PTC Thermistor is thermally connected to the heat sink. The total resistance of the Thermistors may be maintained at about 10 k$\Omega$.

The device may comprise a chip, which may be mounted on a carrier, and the temperature of the chip may be monitored and controlled by monitoring and controlling the temperature of the carrier.

The assembly may form part of an optoelectronic component, for example an EDFA. The chip may include a laser diode.

In accordance with another aspect of the present invention there is provided a method of controlling the temperature of an electronic device. Current is supplied to a heat pump to transport heat from the device to a heat sink. A combined property of two temperature-responsive electrical elements is monitored. One of the electrical is thermally coupled to the device and the other is thermally coupled to the heat sink. The electrical elements are connected in series and have properties that vary in opposite direction with temperature. The combined property is maintained at a substantially constant value by controlling the current supplied to the thermoelectric cooler. As a result, the temperature of the device varies dynamically as a result of the temperature of the heat sink.

Thus the invention, at least in preferred embodiments, enables a direct relationship between the device temperature and the heat sink temperature. This relationship has a significant impact on the cooling power required to maintain the device at a given temperature.

BRIEF DESCRIPTION OF THE DRAWINGS

Some preferred embodiments of the invention will now be described by way of example only and with reference to the accompanying drawings, in which.

DETAILED DESCRIPTION

Figure 1:
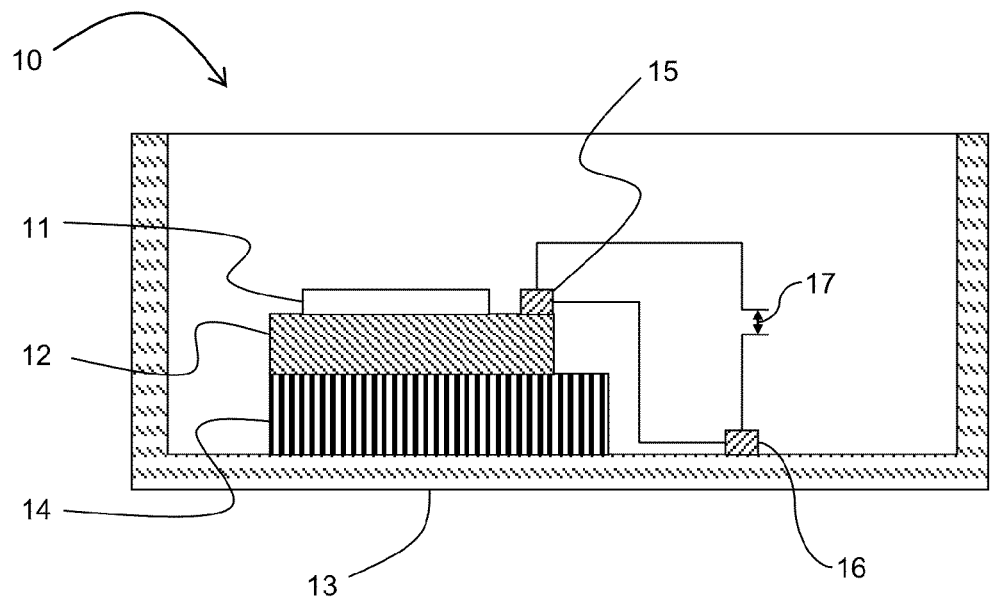
FIG. 1 is a schematic illustration of an optoelectronic device.

FIG. 1 is a schematic illustration of an optoelectronic component 10. The component 10 includes an electronic device such as a chip 11 (for example a laser diode) mounted on a carrier 12 in a casing 13. The laser diode 11 is connected to an output optical fibre (not shown). A Thermoelectric Cooler (TEC) 14 is connected to the carrier 12, and to a heat sink mounted on or integral with the casing 13, to transfer heat from the (relatively cool) carrier 12 to the (relatively hot) casing 13.

A Negative Temperature Coefficient (NTC) Thermistor 15 is thermally coupled on the carrier 12. The resistance of the NTC Thermistor 15 can be measured, and the measured value used to monitor the temperature of the carrier 12. A feedback loop (not shown) controls current supplied to the TEC 14 to ensure that the resistance of the NTC Thermistor 15 is kept at a target value so as to keep the chip 11 on the carrier (CoC) at a selected target temperature.

Figure 2:
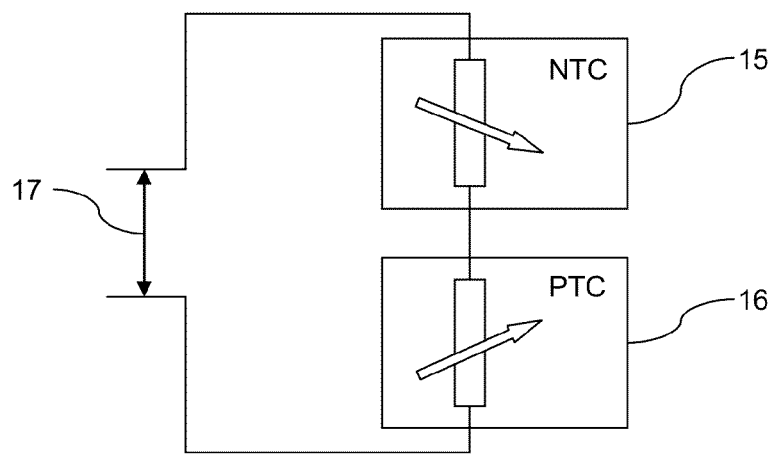
FIG. 2 illustrates the total resistance of an NTC Thermistor and PTC Thermistor in series.

In order to provide dynamic temperature control, a Positive Temperature Coefficient (PTC) Thermistor 16 is thermally bonded to the casing 13 and connected in series to the NTC Thermistor 15 mounted on the carrier 12. The total Thermistor resistance 17 (i.e. the total resistance of the NTC and PTC Thermistors 15, 16) can then be measured, as illustrated in FIG. 2.

The total Thermistor resistance 17 is monitored, and the system is operated to maintain a constant total resistance 17, for example 10 kΩ. If the carrier temperature is low (e.g. at or below about 25° C.) the resistance of the NTC Thermistor 15 is high, and dominates the total resistance. As the casing temperature increases, the resistance of the PTC Thermistor 16 increases. In order to keep the total resistance 17 constant at 10 kΩ the NTC Thermistor 15 resistance must be reduced to compensate for the rise in PTC Thermistor resistance. The target value of the resistance of the NTC Thermistor 15 is therefore reduced, resulting in a higher target carrier temperature to be obtained by the feedback loop. A higher carrier temperature results in a reduction of ΔT between the CoC temperature and the casing temperature, and this reduces the power required to cool the chip 11 on the carrier 12.

Figure 3:
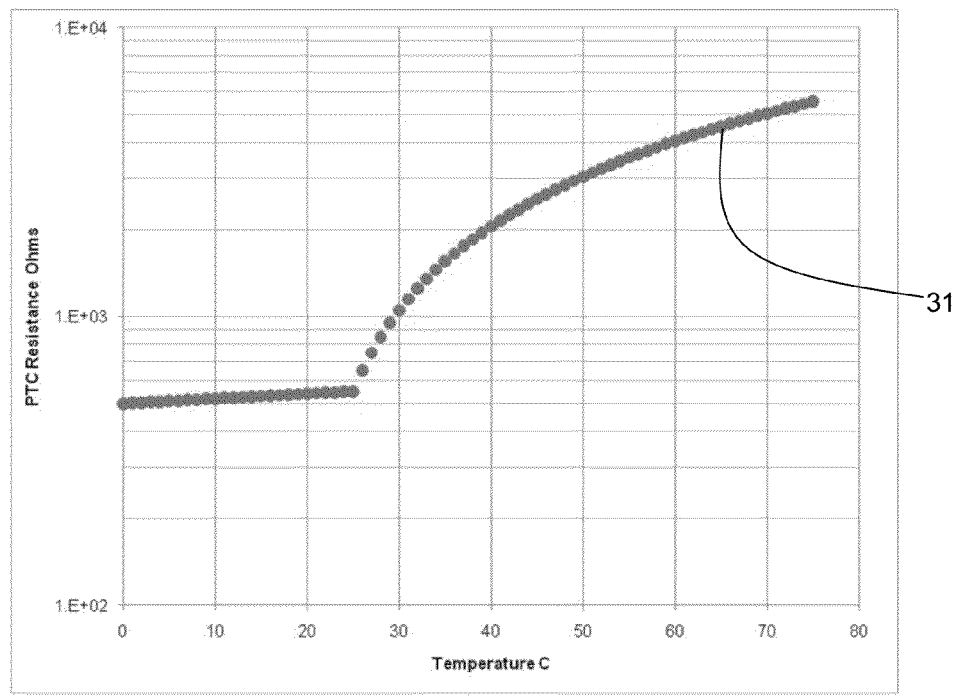
FIG. 3 is a graph illustrating the relationship between resistance and temperature for an exemplary PTC Thermistor.

FIG. 3 illustrates a suitable relationship 31 between resistance and temperature for a PTC Thermistor 16 in a system designed to keep the total resistance 17 at 10 kΩ, and to start having an effect when the temperature rises above 25° C. It will be noted that the PTC resistance is low and constant below 25° C., and the increase in resistance at low casing temperatures (less than about 40° C.) is small.

Thus as the casing temperature increases from 25° C., the initial increase in resistance 31 of the PTC Thermistor 16 is very small. The resistance of the NTC Thermistor 15 therefore does not need to be significantly reduced to keep the total resistance 17 constant, and the effect on the CoC temperature is small. At casing temperatures above about 40° C., there is large increase in the resistance 31 of the PTC Thermistor 16, which must result in a corresponding reduction in the resistance of the NTC Thermistor 15.

Figure 4:
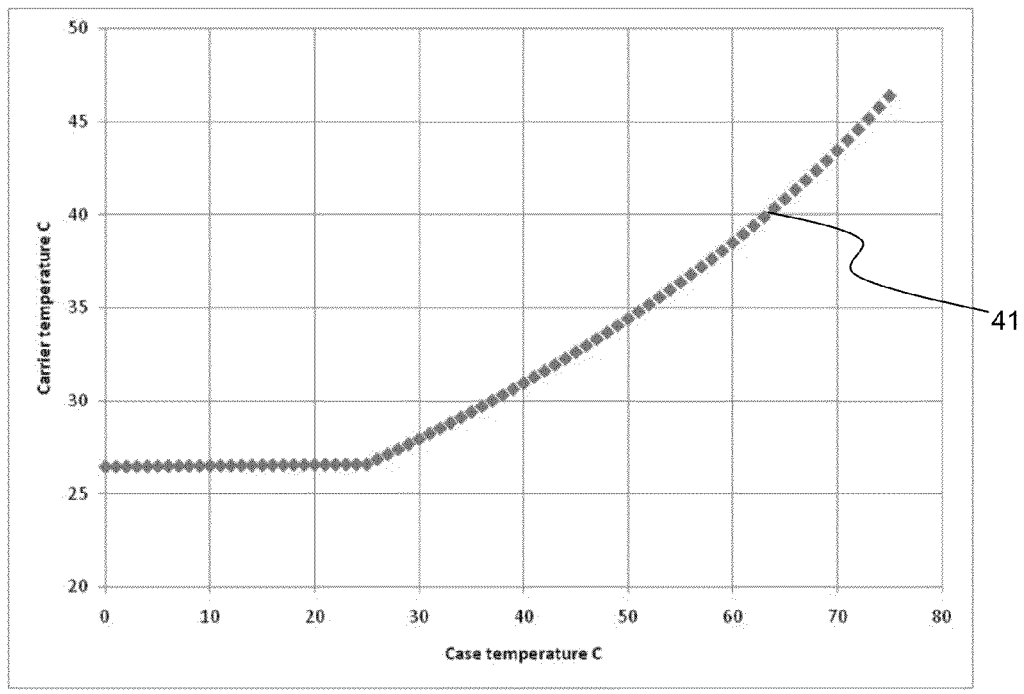
FIG. 4 illustrates an active relationship between carrier temperature and casing temperature.

This system results in a dynamic link between the temperature of the carrier 13 and the temperature of the casing 13. A system using a PTC Thermistor 16 having the properties shown in FIG. 3 results in a direct relationship 41 between carrier temperature and casing temperature, as shown in FIG. 4.

Figure 5:
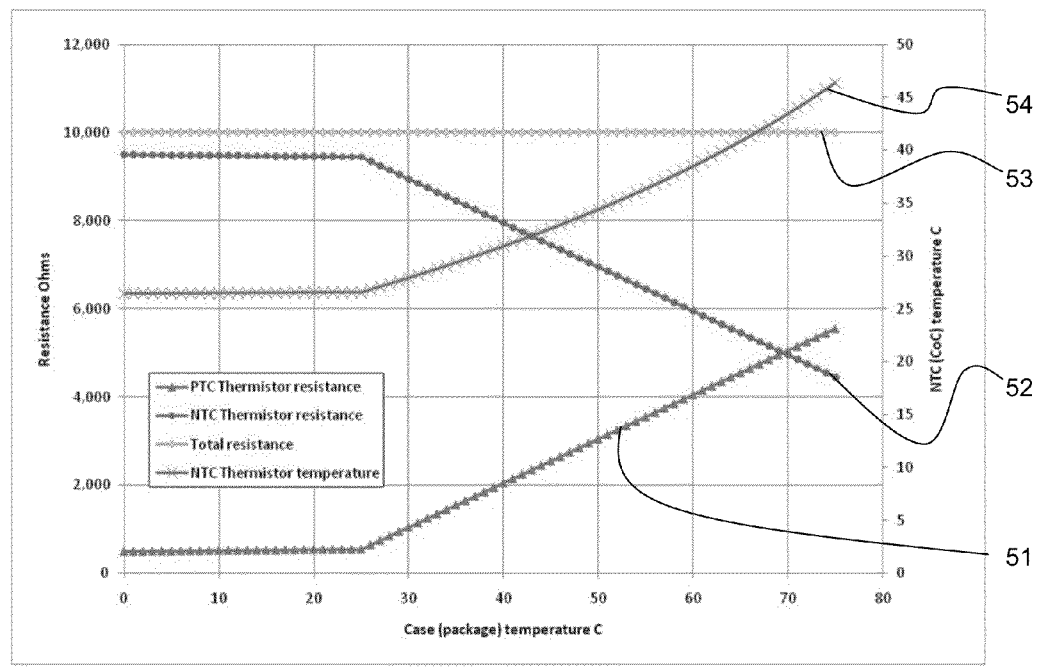
FIG. 5 illustrates the behaviour of PTC resistance, NTC resistance, total resistance and carrier temperature as casing temperature varies.

FIG. 5 illustrates how the PTC resistance 51, NTC resistance 52, total resistance 53 and carrier temperature 54 each varies as a function of case temperature for the system described above.

This dynamic link between the CoC target temperature and casing temperature prevents ΔT between the CoC temperature and casing temperature from becoming too large if the casing temperature rises. This in turn limits that the power required by the TEC. However, the chip temperature does not need to be maintained at a high temperature unnecessarily.

Achieving this active relationship between the chip (laser) temperature and casing temperature (usually the ambient temperature of the module of which the assembly is part) has a significant impact on the cooling power required. The adjustment of the laser temperature in line with the module ambient temperature allows significant reduction in the cooling power. For example, increasing the laser carrier temperature from 25° C. to 40° C. when the case temperature rises to 70° C. will halve the cooling power. The other advantage is that the laser temperature is only kept at higher temperature for the period of time where the ambient temperature is at its heights. For the rest of the time the laser temperature can be lowered accordingly. This reduces the FIT rate of the laser diode chip.

It will be appreciated that variations from the above described embodiments may still fall within the scope of the invention. For example, the set total resistance of 10 kΩ may be varied. In addition, the PTC Thermistor 16 is shown as being thermally bonded to the base of the casing 13, but it will be appreciated that any location where the temperature is linked to the casing temperature may be used. Furthermore, although the system has been described with a NTC Thermistor coupled to the carrier and a PTC Thermistor coupled to the casing, the configuration of the Thermistors could be reversed. Indeed, the invention can be put into effect with any pair of elements having opposite temperature-varying properties such as resistance-temperature detectors (RTDs).

The invention claimed is:

1. An electronic assembly, comprising:
an electronic device;
a heat sink;
a heat pump having thermal connections to the device and the heat sink and configured to transport heat from the device to the heat sink;
a first temperature-responsive electrical element thermally coupled to the device, the first electrical element having a property that varies with temperature in a first direction;
a second temperature-responsive electrical element thermally coupled to the heat sink, the second electrical element having the same property as the first electrical element varying with temperature in a second direction opposite to the first direction; and a control system configured to monitor a combined property of the first and second electrical elements in combination and maintain the combined property at a substantially constant value by controlling current supplied to the heat pump, so that a temperature of the device varies dynamically in response to a temperature of the heat sink;
wherein the property of the second electrical is substantially constant with temperature below a threshold temperature so that, at heat sink temperatures below the threshold temperature, the control system operates to maintain the device at a substantially constant target temperature, and the threshold temperature is a temperature below which a temperature varying property of the second electrical element is substantially constant and above which varies;
and the property of the second electrical element varies with temperature above the threshold temperature so that, at heat sink temperatures above the threshold temperature, the control system operates to increase the target temperature of the device in line with the heat sink temperature.

2. The assembly of claim 1, wherein the threshold temperature is about 25° C.

3. The assembly of claim 1, wherein the heat sink is at an ambient temperature of the environment surrounding the assembly.

4. The assembly of claim 1, wherein the electronic device is provided in a casing, the heat sink being thermally connected to or integral with the casing.

5. The assembly of claim 1, wherein the heat pump is a thermoelectric cooler.

6. The assembly of claim 1, wherein the electrical elements are Thermistors, and the combined property of the two elements in combination is the total electrical resistance of both Thermistors connected in series.

7. The assembly of claim 6, wherein one of the electrical elements is a NTC Thermistor and the other of the temperature-dependent devices is a PCT Thermistor.

8. The assembly of claim 7, wherein the NTC Thermistor is thermally connected to the device and the PTC Thermistor is thermally connected to the heat sink.

9. The assembly of claim 6, configured to maintain the total resistance of the Thermistors at about 10 kΩ.

10. The assembly of any claim 1, wherein the device comprises a chip.

11. The assembly of claim 10, wherein the chip is mounted on a carrier, and the temperature of the chip is monitored and controlled by monitoring and controlling the temperature of the carrier.

12. An optoelectronic component comprising:
an electronic device;
a heat sink;
a heat pump having thermal connections to the device and the heat sink and configured to transport heat from the device to the heat sink;
a first temperature-responsive electrical element thermally coupled to the device, the first electrical element having a property that varies with temperature in a first direction;
a second temperature-responsive electrical element thermally coupled to the heat sink, the second electrical varying with temperature in a second direction opposite to the first direction; and
a control system configured to monitor a combined property of the first and second electrical elements in combination and maintain the combined property at a substantially constant value by controlling current supplied to the heat pump, so that a temperature of the device varies dynamically in response to a temperature of the heat sink;
wherein the property of the second electrical element is substantially constant with temperature below a threshold temperature so that, at heat sink temperatures below the threshold temperature, the control system operates to maintain the device at a substantially constant target temperature, and the threshold temperature is a temperature below which a temperature varying property of the second electrical element is substantially constant and above which varies;
and the property of the second electrical element varies with temperature above the threshold temperature so that, at heat sink temperatures above the threshold temperature, the control system operates to increase the target temperature of the device in line with the heat sink temperature.

13. The component of claim 12, wherein the chip comprises a laser diode.

14. The component of claim 12, which component is an erbium doped fibre amplifier.

15. A method of controlling the temperature of an electronic device, comprising:
supplying current to a heat pump to transport heat from the device to a heat sink;
monitoring a combined property of a first temperature-responsive electrical element thermally coupled to the device and a second temperature-responsive electrical element thermally coupled to the heat sink, the first and second electrical elements being connected in series and having properties that vary in opposite direction with temperature; and
maintaining the combined property at a substantially constant value by controlling the current supplied to the thermoelectric cooler;
wherein the property of the second electrical element is substantially constant with temperature below a threshold temperature so that, a heat sink temperatures below the threshold temperature, a control system operates to maintain the device at a substantially constant target temperature, and the threshold temperature is a temperature below which a temperature varying property of the second electrical element is substantially constant and above which varies;
and the property of the second electrical element varies with temperature above the threshold temperature so that, at heat sink temperatures above the threshold temperature, the control system operates to increase the target temperature of the device in line with the heat sink temperature.

* * * * *